(12) United States Patent
Weekamp et al.

(10) Patent No.: US 9,281,299 B2
(45) Date of Patent: Mar. 8, 2016

(54) SIMPLE LED PACKAGE SUITABLE FOR CAPACITIVE DRIVING

(71) Applicant: KONINKLIJKE PHILIPS N.V., Eindhoven (NL)

(72) Inventors: Johannes Wilhelmus Weekamp, Beek en Donk (NL); Marc Andre De Samber, Lommel (BE); Egbertus Reinier Jacobs, Overloon (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/769,832

(22) PCT Filed: Feb. 14, 2014

(86) PCT No.: PCT/IB2014/058986
§ 371 (c)(1),
(2) Date: Aug. 24, 2015

(87) PCT Pub. No.: WO2014/132164
PCT Pub. Date: Sep. 4, 2014

(65) Prior Publication Data
US 2015/0380390 A1 Dec. 31, 2015

Related U.S. Application Data

(60) Provisional application No. 61/770,413, filed on Feb. 28, 2013.

(51) Int. Cl.
*F21V 1/00* (2006.01)
*H05B 37/00* (2006.01)
(Continued)

(52) U.S. Cl.
CPC ............ *H01L 25/0753* (2013.01); *H01L 33/42* (2013.01); *H01L 33/50* (2013.01); *H01L 33/56* (2013.01); *H01L 33/58* (2013.01); *H01L 33/62* (2013.01); *H05B 33/0821* (2013.01)

(58) Field of Classification Search
USPC ................... 362/235–238, 240, 249.02, 257; 315/246, 192
See application file for complete search history.

(56) References Cited

U.S. PATENT DOCUMENTS 6,998,642 B2   2/2006   Lin et al.
7,498,252 B2   3/2009   Lee et al.
(Continued)

FOREIGN PATENT DOCUMENTS

JP      06045657 A     2/1994
WO    2009153715 A2   12/2009

OTHER PUBLICATIONS

Chung-Mo Yang et al; "Enhancement in Light Extraction Efficiency of GaN-Based Light-Emitting Diodes Using Double Dielectric Surface Passivation", Optics and Photonics Journal, 2012, vol. 2, pp. 185-192.

*Primary Examiner* — Minh D A

(57) ABSTRACT

The invention relates to a LED package (10) suitable for capacitive driving, comprising at least one pair of anti-parallel oriented LEDs (20, 30). These LEDs are provided with electrical terminals (21, 22, 31, 32) at opposing surfaces of the LEDs. The LEDs are sandwiched between two substantially parallel oriented substrates (40, 50) of a dielectric material, which substrates are provided on their facing surfaces (41, 51) with a film (42, 52) of electrically conductive material, so that electrical contacts (61, 62) are available between the electrical terminals and the films of electrically conductive material. The LED package is cheap, technically simple, reliable and small-dimensioned, and can be applied in a LED assembly. A method for manufacturing such LED packages is claimed as well.

12 Claims, 1 Drawing Sheet

(51) Int. Cl.
*H01L 25/075* (2006.01)
*H01L 33/62* (2010.01)
*H01L 33/42* (2010.01)
*H01L 33/56* (2010.01)
*H01L 33/58* (2010.01)
*H01L 33/50* (2010.01)
*H05B 33/08* (2006.01)

(56) References Cited

U.S. PATENT DOCUMENTS

| | | |
|---|---|---|
| 2003/0025212 A1 | 2/2003 | Bhat et al. |
| 2005/0212406 A1 | 9/2005 | Daniels et al. |
| 2008/0218095 A1 | 9/2008 | Erhardt |
| 2010/0259930 A1 | 10/2010 | Yan |
| 2011/0018011 A1 | 1/2011 | Beeson et al. |
| 2011/0084624 A1 | 4/2011 | Dekker et al. |
| 2011/0089464 A1 | 4/2011 | Lin et al. |
| 2011/0121723 A1 | 5/2011 | Chen et al. |
| 2011/0234114 A1* | 9/2011 | Miskin ............ F21K 9/17 315/192 |
| 2012/0106171 A1 | 5/2012 | Wang et al. |
| 2012/0162984 A1* | 6/2012 | Fujimori .......... H01L 33/60 362/235 |
| 2012/0261242 A1 | 10/2012 | Guard et al. |

* cited by examiner

SIMPLE LED PACKAGE SUITABLE FOR CAPACITIVE DRIVING

CROSS-REFERENCE TO PRIOR APPLICATIONS

This application is the U.S. National Phase application under 35 U.S.C. §371 of International Application No. PCT/IB14/058986, filed on Feb. 14, 2014, which claims the benefit of U.S. Provisional Patent Application No. 61/770,413, filed on Feb. 28, 2013. These applications are hereby incorporated by reference herein.

FIELD OF THE INVENTION

The invention relates to a LED package suitable for capacitive driving, comprising at least one pair of anti-parallel oriented LEDs. The invention also relates to a LED assembly comprising a plurality of LED packages. The invention further relates to a method for manufacturing a LED package suitable for capacitive driving. Such LED structures may be used both in illumination and light signage applications.

BACKGROUND OF THE INVENTION

A light-emitting diode (LED) is an energy efficient solid state light (SSL) source, which is currently used in a wide variety of lighting applications. A feature in common for all these applications is that the LEDs involved need to be driven by an electrical power supply in order to have the LEDs emit light. According to a widely known technique wired LEDs (i.e. LEDs being provided with 'galvanic' conducting leads) may be powered by a direct current (DC). This technique requires the use of thin metal wires, which are soldered or glued to one or both of the electrical terminals of the LEDs. The LEDs may also be soldered directly (wireless) on a printed circuit board (PCB).

A more recent technique for powering LEDs is based on so-called 'capacitive driving' in which an alternating current (AC) is applied. In this technique pairs of so-called anti-parallel oriented LEDs are used. In such a LED pair, the cathode of one of the LEDs is electrically connected to the anode of the other LED, whereas the anode of the one LED is electrically connected to the cathode of the other LED. In this respect, it should be realized that LEDs are electrical components or diodes having a polarity, meaning that a relevant electrical current can flow through a LED only in one direction, the opposite direction being blocked.

LED packages suitable for capacitive driving are known as such, for example from the patent application published as US2008/0218095A1. More particularly FIG. 2B in this document shows a cross-section of such a package, which essentially comprises a capacitor composed of a dielectric substrate sandwiched between two conductive plates. An anti-parallel oriented LED structure is electrically connected to one of these plates and thermally coupled to the substrate. Various connector wires are present for capacitive driving of the described LED package.

Although the known LED package has proved to function satisfactorily, its design requires a relatively bulky structure. This causes that miniaturization of the known LED package is a difficult task. Moreover, the presence of conducting wires in the known package usually requires soldering techniques. However, in such structures solder connections are apt to degrade over time due to the relatively high temperatures produced by LEDs when they are powered to emit light.

SUMMARY OF THE INVENTION

It is an object of the invention to provide an alternative LED package, in which the disadvantages of the known package are absent or at least mitigated. The invention especially aims at a low-cost LED package, which is moreover technically simple, reliable and has relatively small dimensions. The LED package according to the invention should preferably be free of solder connections. The invention further aims at providing a method for manufacturing such an improved LED package and at a LED assembly comprising a plurality of LED packages.

These and possible other objects of the invention are achieved by means of a LED package suitable for capacitive driving, comprising at least one pair of anti-parallel oriented LEDs, which LEDs are provided with electrical terminals at opposing surfaces of the LEDs, whereby the LEDs are sandwiched between two substantially parallel oriented substrates of a dielectric material, which substrates are provided on their facing surfaces with a film of electrically conductive material, so that electrical contacts are available between the electrical terminals and the films of electrically conductive material.

The invention is based on the insight acquired by the inventors that simple, small-dimensioned and cheap LED packages for capacitive driving can be designed when positioning the LEDs between two metallized sheets of dielectric material. Such sheets are widely available and used in capacitive structures, especially as film (also called: foil) capacitors. As will be described below in more detail, such packages can easily be incorporated in LED assemblies, which can be connected to an AC power supply for driving the LED packages. During activation of the power supply, a capacitive coupling is constituted, which is electrically comparable to a conventional capacitor, and electrical charge is transported to the film of electrically conductive material and via the electrical contacts, that are established between the film of electrically conductive material and the electrical terminals of the LEDs, to the LEDs, which are positioned between and electrically connected to said films. These films are composed of a thin layer of a metal or metal alloy.

Within the course of the present invention, different types of LEDs may be used. The LEDs have electrical terminals (both an anode terminal and cathode terminal) at two opposing surfaces of the LED component, as is currently the case for most commercially available LEDs. In practice, such terminals cover only a small part of such surfaces. LEDs having this design can be placed between the dielectric substrates while contacting the film of electrically conductive material present on the facing main surfaces of both substrates. LEDs which have the terminals at a common surface only, may be adjusted for having also terminals at opposing surfaces in order to be suitable for use in packages according to the present invention. The LEDs may be top-emitting (i.e. emitting light essentially through one or both of the electrical terminals) or side-emitting (i.e. emitting light through one or more sides of the LED which are not provided with an electrical terminal). The LEDs that are comprised in the package may be all of the same type, but also different types of LEDs can be used, such as LEDs emitting light with different wavelengths, which may cause color effects in the package.

The at least one pair of LEDs may comprise discrete LED pairs, i.e. components consisting of two LEDs which are mutually bonded via a bonding layer and which are oriented in an anti-parallel fashion. Thus the cathode of a first LED in such a discrete LED pair is at a close distance to the anode of a second LED in such a discrete LED pair, whereas the cathode of the second LED is at a close distance to the anode of the first LED. Such discrete LED pairs may be positioned in a relatively simple way between the substrates of dielectric material, as they may be positioned in a random manner, independent of the polarity of the component. The at least one pair of LEDs may however also comprise a plurality of at least two individual LEDs. During positioning of such individual LEDs, care should be taken that (approximately) half of the components are positioned such that the anode contacts the electrically conductive film of the first substrate of dielectric material and the cathode contacts the electrically conductive film of the other substrate, whereas the other (approximately) half of the components are positioned in the opposite way.

An interesting embodiment of the LED package according to the present invention shows the feature that the electrically conductive material comprises a metal or metal alloy, preferably a noble metal (alloy), more preferably a gold (alloy). It has appeared that the thickness of the film of conductive material may be chosen very small if a metal or metal alloy is used. Layer thicknesses less than 0.1 micron provide sufficient electrical conductivity to function well in the AC driven LED packages. When using a noble metal (alloy), a film thickness of 50 nanometers or less may suffice to form good non-corrosive contacts between the films and the LED terminals. Especially films of gold (alloys) can be used with great advantage, as the terminals of commercially available LEDs usually comprise gold (alloys). Film thicknesses range typically between 10 and 30 nanometers.

Depending on the circumstances, satisfactory electrical contacts may be formed by thermo compression or mechanical pressure contacts between the electrical LED terminals and the films of electrically conductive material. In the LED packages according to the present invention, there is no need for the use of galvanic connections, as may be provided by means of different types of soldering techniques. As a result the invented LED packages are less sensitive to temperature dependent degradation of solder connections, so that the lifetime of the LED packages may be increased.

Another interesting embodiment of the invented LED package has the feature that the substrates comprise a layer of resin material, preferably a polyvinylidene difluoride (PVDF) resin material. Polymer resin substrates can be simply produced as sheets having a desired thickness and flexibility. The availability of metallized substrates of a polymer resin as currently applied in foil capacitors causes that the invented LED packages can be manufactured in a very cheap manner. Such substrates or foils have on one of their main surfaces a thin film of electrically conductive material, usually in the form of a metal or a metal alloy. Such a metal (alloy) is deposited on the polymer resin foils by means of sputtering, spraying or evaporation. The polymer resin substrates usually have a thickness below 20 micron. Typically foils having a thickness below 10 micron are used, which may result in desired higher capacity values. Poly Ethylene Terepthalaat (PET) is a well-known polymer resin for such foils, which can be applied with great advantage as a substrate material for the invented LED packages. However, the polymer resins Poly Ethylene Naphtalate (PEN) and Poly Propylene Sulfide (PPS) have the advantage of higher melting temperatures, which makes these polymers especially suitable for use in LED packages with thermo compressed contacts between the electrical LED terminals and the electrically conductive film on the substrates. Due to its high transparency for visible light and a relatively high value of the dielectric constant of approximately 12, substrates of PVDF are currently most preferred.

A further embodiment of interest concerns a LED package having the characteristic that at least part of the space between the substrates is filled with an optically transparent sealing material. The presence of such a sealing material improves the mechanical rigidity of the package, especially when the packages are cut to a required size. The sealing material may moreover maintain press-induced electrical contacts between the electrical LED terminals and the electrically conductive films on the substrates. Various sealing materials have demonstrated to be useful, of which epoxy sealing materials are preferred. The sealing material Epotek 301 has proved to be especially suitable because of its low viscosity before curing, its good adhesion to the substrates and its high optical transparency in the visible wavelength range. For obtaining uniform lighting effects, preferably the complete space is filled with sealing material.

Interesting is also the special embodiment of the LED package in which the sealing material comprises scattering particles. The presence of such particles improves the outcoupling of the light generated by the LEDs to a direction normal to the flat structure of the LED package. Suitable scattering particles are typically composed of metal oxides, like the preferred $TiO_2$, and have preferably a mean particle size ranging between 1 and 50 microns. Useful concentrations may range between 5 and 90% by weight.

Also interesting is a LED package of the present invention wherein the sealing material comprises phosphor particles. As the phosphor particles may convert the wavelength of the light emitted by the LEDs, special color effects can be obtained with LED packages according to this embodiment. Upon proper choice of the phosphor particles, blue light (with a wavelength of about 450 nm) or UV radiation (with even smaller wavelengths) generated by the LEDs may be converted to red and green light, so that the mixed blue/UV, red and green light may be outcoupled from the device as, for example, white light. Mixtures of phosphors may be used to obtain desired color effects. Based upon the requirements for the LED package, a skilled person can routineously select the needed type of LEDs and (mixtures of) phosphor particles.

The invention also relates to a LED assembly, comprising a plurality of LED packages according to the present invention. In such a LED assembly, the packages are sandwiched between two support layers, which support layers are provided on their facing surfaces with an electrode layer, whereby each of the electrode layers contacts a substrate of the LED packages, and whereby the electrode layers are provided with power supply terminals for electrically contacting a power supply. Such a power supply terminal is preferably positioned at a rim of a support layer. Power supply terminals which clamp around the support layer rims are preferred.

In an embodiment of the LED assembly, both support layers are optically transparent for the LED light which can be generated by the LED packages. Such an assembly may illuminate through both of its main surfaces. For specific purposes, LED assemblies having only one optically transparent support layer may also be useful. The non-transparent support layer may have a reflective, specular or diffuse surface, and may be colored or white. Such LED assemblies are useful for illuminating through only one of their main surfaces, and are therefore suitable to be attached to a surface like a wall, a ceiling, etc. with its non-transparent support layer. Support layers may be made of different materials, like ceramics, polymer resins, metals etc. . . . . LED assemblies having one or both of their support layers made of glass have proved to be especially useful in the present invention.

Another useful embodiment of the present invented LED assembly has the feature that the electrode layers comprise a transparent material. This feature is especially useful in combination with support layers which are transparent for the LED light emitted by the LED packages. Such emitted light can pass both the optically transparent electrode layer and the optically transparent support layer. Electrode layer materials like Indium Tin Oxide (ITO) and Antimone Tin Oxide (ATO) or their mixtures have proved to be very suitable for such situations.

The invention also relates to a method for manufacturing a LED package for capacitive driving, comprising the steps of: 1) positioning a plurality of LEDs with one of their electrical terminals on a first film of electrically conductive material provided on a first substrate of a dielectric material, such that approximately half of the LEDs electrically contact the film via their anode and the remaining LEDs via their cathode, 2) applying a second film of electrically conductive material, which is provided on a second substrate of a dielectric material, on the free electrical terminals of the plurality of LEDs, and 3) heating the LED package during a time period while pressing together the first and the second substrate until stable electrical contacts have formed between the electrical terminals and the films.

The present method is well-suited for the manufacture of LED packages in roll-to-roll production or wafer-to-wafer production. Preferably a manufacturing step of applying a layer of transparent sealing material on the film of the first substrate is included in the method. To achieve a more reliable manufacturing process, it is useful to apply said material before positioning the plurality of LEDs on the conductive film. Said sealing material preferably comprises scattering and/or phosphor particles. Advantageously, a step is included in which a second layer of a transparent sealing material is applied on the free terminals of the plurality of LEDs which have been provided on the first substrate, before the second substrate is applied. The thus produced LED assembly precursor sheet may be cut into final size as a last method step.

BRIEF DESCRIPTION OF THE DRAWINGS

These and other aspects of the invention will be apparent from and elucidated with reference to the embodiments described hereinafter.

In the drawings.

It is stressed that the drawings are schematic and not to scale. In the different Figures, the same elements are denoted with the same reference numbers.

DETAILED DESCRIPTION OF EMBODIMENTS

Figure 1:
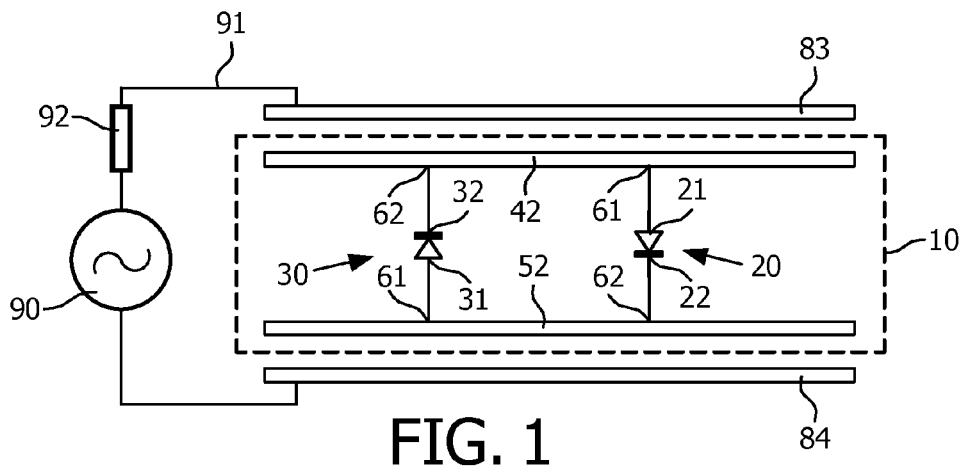
FIG. 1 shows an exemplary circuitry of a LED assembly comprising a LED package according to the present invention.

FIG. 1 illustrates circuitry which may be used for capacitive driving of a LED package according to the present invention. More particularly, the LED package 10 is schematically depicted such that the elements of the package are within the boundaries of a dotted line. The LED package 10 shown here comprises a pair of anti-parallel oriented LEDs 20 and 30. First LED 20 comprises two electrical terminals, more particularly anode 21 and cathode 22. Second LED 30 also comprises two electrical terminals, more particularly anode 31 and cathode 32. In the LED package, the two LEDs are connected in an anti-parallel configuration, meaning that the cathode of the first LED 20 is electrically connected with the anode of the second LED 30, and vica versa. During operation of the LED package 10, electrical current may flow from the anode to the cathode, whereas the electrical current flow in opposite direction is blocked. It is noted that in principle one of the LEDs 20, 30 of the depicted pair of LEDs may be replaced by another type of polar diode without departing from the inventive concept, as long as the anti-parallel configuration is maintained.

The pair of LEDs is sandwiched between first film 42 and second film 52, both made of an electrically conductive material. The LEDs are positioned in such a manner between said films, that reliable electrical contacts 61, 62 are available between the electrical terminals (anode and cathode) of the LEDs and the films. As the electrical terminals are present on opposing surfaces of the LEDs, the anode will be in electrical contact with the one film of electrically conductive material and the cathode with the other film.

Furthermore, the circuitry comprises an AC power supply 90 which is connected via wiring 91 to first electrode layer 83 and second electrode layer 84. Depending on the circumstances, additional components 92, like inductors etc., may be present in wiring 91. Dielectric layers are present between the first film 42 and the second film 52 of electrically conductive material comprised in LED package 10 and the first electrode layer 83 and the second electrode layer 84, which are connected to AC power supply 90. The anti-parallel configuration of the pair of LEDs 20, 30 makes LED package 10 suitable for operation by means of AC power supply 90. During a first time period (corresponding to a first half period of the sine function of the AC power supply) current flows through the first LED 20, whereas the current flow in LED 30 is blocked. During a second time period (corresponding to a second half period of the sine function of the AC power supply), current flows through the second LED 30, whereas the current flow in LED 20 is blocked.

It is noted that more than one pair of anti-parallel oriented LEDs may be comprised in the LED package according to the present invention. If using a plurality of LEDs per package, the number of LEDs oriented in the one direction need not be exactly identical to the number of LEDs oriented in the opposite direction. Moreover, the LEDs do not need to be positioned as pairs (on short distance) in the package, but can be positioned quite randomly between the substrates. As stated before, other polar diode components may be included in the package, and may even replace one or more LEDs.

As indicated by the dotted rectangle in FIG. 1, LED package 10 may be physically separated from the electrode layers 83, 84 of AC power supply 10. The space between the first and second films 42 and 52 and the first and second electrode layers 83 and 84 is filled with a layer of dielectric material, which in principle may be air. In practice, layers of solid dielectric materials will be used. Any of such dielectric layers (shown in FIG. 2 in more detail) may be part of (and physically connected to) the electrode layers of the power supply, but are preferably part of the LED package 10. Due to this construction, the LED package is electrically connected with the AC power supply via a so-called capacitive coupling.

Figure 2:
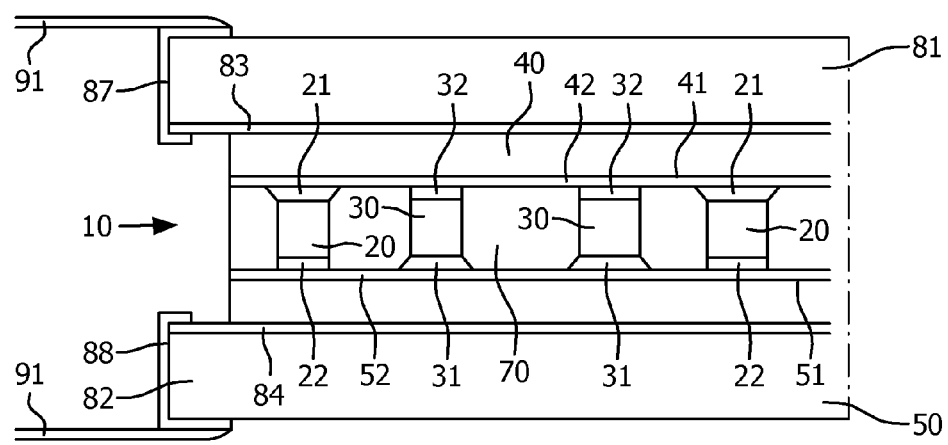
FIG. 2 shows in cross-section an exemplary LED assembly comprising a LED package according to the present invention.

FIG. 2 shows in cross-section and not to scale a part of a LED assembly 80 (including its rim), comprising a LED package 10 with two pairs of LEDs 20 and 30, having an anti-parallel oriented configuration. The LED assembly usually comprises a plurality (up to thousands or more) of such LED packages, which may be present in ordered or in random configuration, if wished according to a predetermined design.

In the present example, LED package 10 comprises identical side-emitting LEDs, which have two electrical terminals (anode 21, 31 and cathode 22, 32) at opposing end faces of the side-emitting LEDs, which terminals comprise a sputtered top layer substantially of a gold alloy. These commercially available blue LEDs have a cross-section and a length (from anode to cathode) of about 350 microns. Upon powering, light with a wavelength of approximately 450 nm is emitted by the LEDs. All pairs of LEDs are positioned between two substrates 40 and 50, which run substantially parallel with respect to each other. These substrates are composed of the electrically non-conducting, dielectric material PVDF and have a thickness of 6 microns. On the facing main surfaces 41 and 51 of the substrates 40 and 50, films 42 and 52 of an electrically conductive material have been provided by means of sputtering. In the present case, films 42 and 52 are composed of gold and have a thickness of approximately 20 nanometers.

The space between the substrates aside the LEDs may be filled with an optically transparent epoxy sealing material 70, for example of the type Epotek 301. For improving the out-coupling of the blue light emitted by the LEDs during operation of the LED package, scattering particles may be present in the sealing material. These scattering particles are present as hollow glass balls, having a mean grain size of 10 micron. In an alternative embodiment, scattering particles of a phosphor material of the type Ce3+:YAG are used, having a mean grain size of 5 microns. In the latter embodiment, part of the blue light is converted to light of a longer wavelength. By proper selection of the LEDs and various phosphor particles, LED packages may be designed which emit white light.

The LED package is sandwiched between two support layers 81 and 82 of glass, both having a thickness of 500 microns. The facing main surfaces of support layers 81 and 82 comprise electrode layers 83 and 84 of Indium Tin Oxide having a thickness of approximately 50 nanometers. These electrode layers 83 and 84 are held in intimate contact with the substrates of dielectric material by means of clamping. The electrode layers 83 and 84 extend until the rim of the support layers. Clamping power supply terminals 87 and 88 on the rim provide for an electrical contact to an AC power supply (not shown) via wiring 91. Upon powering by means of the AC power supply, the LEDs in the package emit light. Part of this light may be converted to light with longer wavelength upon interaction with phosphor particles, if present in the transparent sealing material. The (converted) light is out-coupled through the substrates and the support layers to the outside, as a result of the presence of the scattering particles in the cured sealing material.

Figure 3:
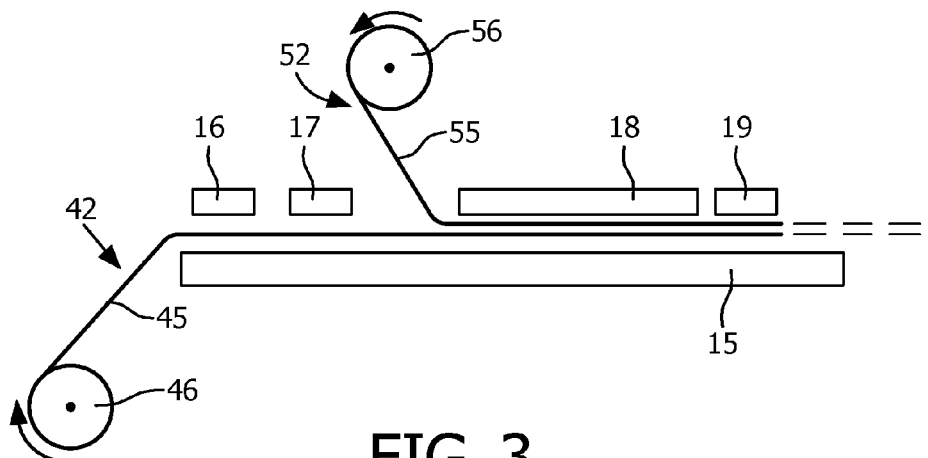
FIG. 3 shows a method for manufacturing a LED package according to the present invention.

FIG. 3 shows schematically and not to scale a method for manufacturing LED packages according to the invention in a continuous process. In this process, a sheet 45 of substrate material (here PVDF) being provided with a first film 42 of electrically conductive material (here a gold alloy) on one of its main surfaces, is continuously fed from a first roll 46 and transported over a bench 15. In a first handling station 16, a transparent sealing material comprising scattering particles is applied on the electrically conductive surface of the sheet. In a second handling station 17, LEDs (not shown) are positioned on the electrically conductive surface of the sheet, for example by means of a pick-and-place machine. The positioning of the LEDs may be in a random manner or according to a predetermined design. The positioning should be arranged such that approximately half of the LEDs is positioned with their anode terminal on the electrically conductive surface whereas the other part of the LEDs is positioned with their cathode terminal on the electrically conductive surface.

In a next step, a sheet 55 of substrate material (here PVDF) being provided with a second thin film 52 of electrically conductive material (here a gold alloy) on one of its main surfaces is continuously fed from a second roll 56 and positioned with the electrically conductive surface on the free terminals of the LEDs. In handling station 18, both sheets, while running through the station during a period of time, are pressed together at certain temperature and with a certain amount of pressure, the values of which parameters depend on various conditions. The sandwiched sheets 45 and 55 are thus cured during travelling over the bench 15. In a final handling station 19, the sandwiched sheets are cut to fragments of desired size and shape (rectangular, square, oval, circular, etc.). These fragments are ready for use as LED packages in a LED assembly.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An LED assembly, comprising a plurality of LED packages suitable for capacitive driving, each LED package comprising:
   at least one pair of anti-parallel oriented LEDs, which LEDs are each provided with electrical terminals, including an anode and a cathode terminal, at opposing surfaces of the LEDs,
   two substantially parallel oriented substrates of a dielectric material, which substrates are provided on their facing surfaces with a film of electrically conductive material, whereby the LEDs are sandwiched between the two substantially parallel oriented substrates of the dielectric material, so that electrical contacts are available between the electrical terminals and the films of electrically conductive material,
   said LED packages being sandwiched between two support layers, which support layers are provided on their facing surfaces with an electrode layer, whereby each of the electrode layers contacts the dielectric substrate of the LED packages, and whereby the electrode layers are provided with power supply terminals for electrically contacting an AC power supply.

2. The LED assembly according to claim 1, wherein both of the support layers are optically transparent for LED light which can be generated by the LED packages.

3. The LED assembly according to claim 2, wherein at least one of the support layers is made of glass.

4. The LED assembly according to claim 1, whereby the electrode layers comprise a transparent material, preferably at least one of ITO and ATO.

5. The LED assembly according to claim 4, whereby the power supply terminals are positioned at a rim of the support layers.

6. The LED assembly according to claim 4, wherein electrode layers extend until the rim of the dielectric support layers and the power supply terminals clamp around the rim of the support layers.

7. A Circuitry for capacitive driving of a LED package, the circuitry comprising the LED assembly according to claim 4, and an AC power supply which is connected to the electrode layers.

8. The LED assembly according to claim 1, wherein the electrically conductive material comprises a metal or metal alloy, preferably a noble metal (alloy), more preferably a gold (alloy).

9. The LED assembly according to claim 1, wherein the substrates comprise a layer of resin material, preferably a polyvinylidene difluoride resin material.

10. The LED assembly according to claim 1, wherein at least part of the space between the substrates is filled with an optically transparent sealing material.

11. The LED assembly according to claim 1, wherein the sealing material comprises scattering particles.

12. The LED assembly according to claim 1, wherein the sealing material comprises phosphor particles.

* * * * *